United States Patent [19]

Hori et al.

[11] Patent Number: 4,691,304

[45] Date of Patent: Sep. 1, 1987

[54] SEMICONDUCTOR DEVICE HAVING AN ARRANGEMENT FOR PREVENTING OPERATIONAL ERRORS

[75] Inventors: Ryoichi Hori, Tokyo; Kiyoo Itoh, Higashikurume, both of Japan

[73] Assignee: Hitachi, Ltd., Tokyo, Japan

[21] Appl. No.: 739,092

[22] Filed: May 30, 1985

[30] Foreign Application Priority Data

May 30, 1984 [JP] Japan ............................. 59-108365

[51] Int. Cl.$^4$ ............................................. G11C 7/00
[52] U.S. Cl. ................................... 365/226; 365/227; 307/296 A
[58] Field of Search ............................. 365/226, 227; 307/296 A

[56] References Cited

U.S. PATENT DOCUMENTS

| | | | |
|---|---|---|---|
| 4,233,672 | 11/1980 | Suzuki et al. .................... | 365/226 X |
| 4,409,678 | 10/1983 | Takemae et al. ............... | 365/226 X |
| 4,455,628 | 6/1984 | Ozaki et al. ....................... | 365/226 |

Primary Examiner—Joseph A. Popek
Attorney, Agent, or Firm—Antonelli, Terry & Wands

[57] ABSTRACT

This invention relates to a semiconductor device formed on a semiconductor chip which is provided with at least a voltage transformation arrangement for transforming an external power supply voltage into an internal power supply voltage. At least a portion of circuits formed in the chip operate by using the internal power supply voltage rather than the external power supply voltage. Semiconductor devices, in particular DRAMs (dynamic random access memories), in which said internal power supply voltage is supplied are controlled so that the starting time of the internal power supply voltage at the moment of the switch-on of the external power supply is later than the starting time of the external power supply voltage, and/or the time necessary for the internal power supply voltage to increase to a predetermined operational level at said moment is longer than that required for said external power supply voltage to increase to a predetermined operational level.

18 Claims, 36 Drawing Figures

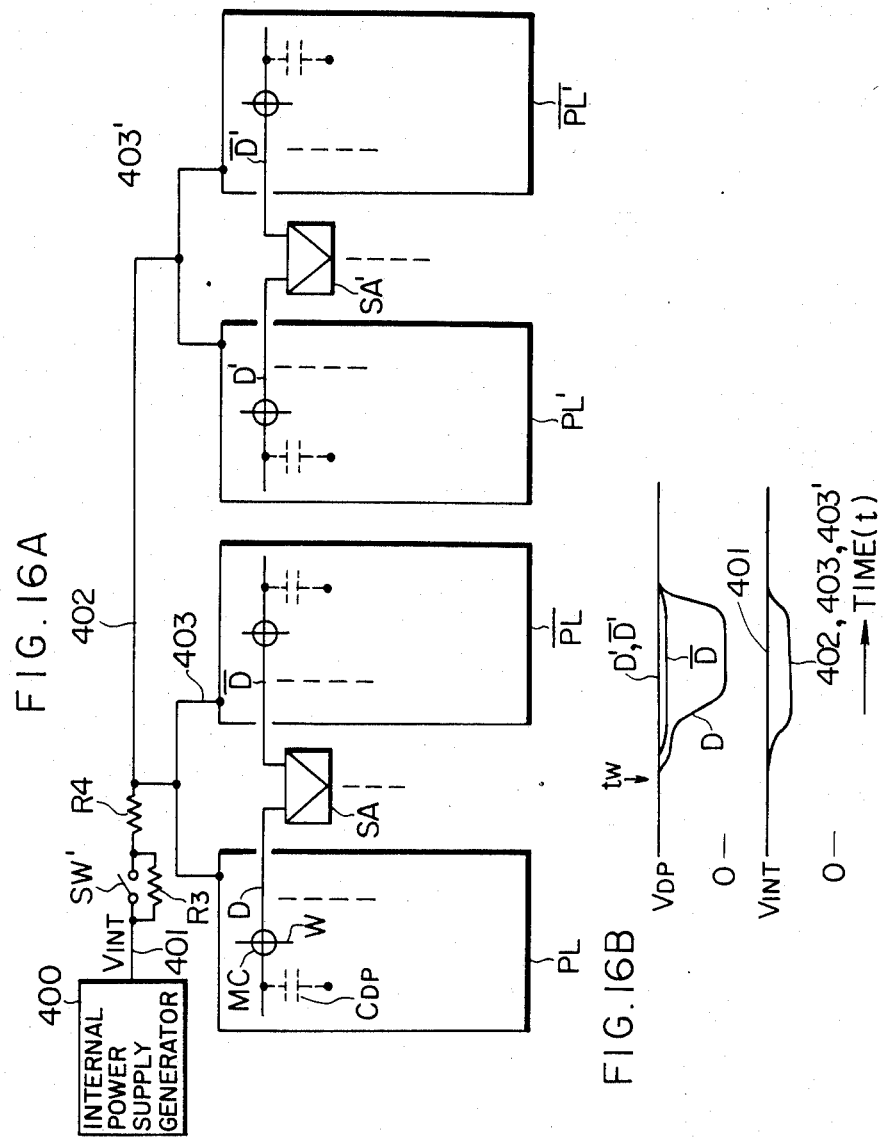

SEMICONDUCTOR DEVICE HAVING AN ARRANGEMENT FOR PREVENTING OPERATIONAL ERRORS

BACKGROUND OF THE INVENTION

This invention relates to a semiconductor device suitable for resolving problems, such as large spike current arising when the power supply is switched-on or due to voltage fluctuations during operation, erroneous operation, etc. in the semiconductor device.

It is known that in semiconductor devices, during a certain period of time from the switch-on of the power supply to stabilization in the normal operation state, since the state in the interior of the semiconductor devices is different from the normal operation state, various problems can be produced. One of the most important problems among those arising at the moment of the switch-on of the power supply is production of a large spike current, which can eventually break down the power supply equipment for operating semiconductor devices or the semiconductor devices themselves. The outline of the mechanism giving rise to this spike current will be approximately explained, referring to FIGS. 1A and 1B.

FIG. 1A shows schematically a cross-sectional structure of main parts in an MOS dynamic random access memory (hereinbelow abbreviated to DRAM). Here is shown an example of DRAMs incorporating a back bias generator in the chip, forming the main current in recent DRAMs. Further, the shown example uses a so-called one-transistor-type cell, for which a memory storing one-bit information consists of an MOS transistor acting as a switching device and a capacitor for accumulating information charge. In the figure, the reference numeral 300 indicates the on-chip back bias generator state above. Although the generator 300 is indicated for convenience as separated from the chip, which is a silicon substrate 1, and as a circuit schematic, in reality it is of course disposed principally in the surface portion of the substrate 1 or integrated in its neighborhood. The circuit construction shown within a frame in chain-dotted line indicated by 300 is an example, where the back bias $V_{BB}$ is generated by the well known charge pumping method, in which OSC denotes a circuit for producing a cyclic signal for the charge pumping, which consists usually of a ring oscillator circuit. $C_{PB}$ represents a capacitor for the charge pumping, which is formed in many cases by utilizing an MOS capacitor. D indicates a rectifying diode, for which, in many cases, an MOS transistor is used as a diode by connecting the drain and the gate together. This circuit construction and its working mode are described in detail in 1976 ISSCC Digest of Technical Papers, pp. 138–139.

The reference numeral 1 represents the silicon substrate, which is a p-conductivity type silicon substrate, in the case where the principal element constituting the circuit is an n-channel MOS transistor and an n-conductivity type silicon substrate, in the case where the principal element constituting the circuit is a p-channel MOS transistor. However, here an example for the former case will be explained. The reference numeral 2 indicates an insulating film for isolating different elements. Numerals 3a–3b denote relatively high concentration n-conductivity type (hereinbelow called n+ type) impurity diffusion layers; and 4a–4c denote gate electrodes, which are made of polysilicon, refractory metal such as Al, W, Mo, etc., or silicide such as $WSi_2$, $MoSi_2$, etc. The gate electrodes 4a–4c can be fabricated, according to circumstances, by a different fabrication step or they can be made of another material. Although there exist gate insulating films between the gate electrodes 4a–4c and the substrate 1, they are not shown in the figure for the sake of clarity.

The gate electrode 4a, and the impurity diffusion layers 3a and 3b constitute a switching MOS for a memory cell. The reference numeral 4b is an electrode of storage capacitor (hereinbelow called a plate electrode) and a capacitor is formed between this electrode and the inversion layer 5 produced directly below the electrode. The insulating film existing between the electrode 4b and the inversion layer and acting as a dielectric body is not indicated in the figure, as stated above. The gate electrode 4c, the impurity diffusion layers 3d and 3e also constitute an MOS transistor, which is indicated as a representative of MOS transistors constituting a circuit other than the memory cell.

In the figure, the reference numerals 7 and 8 show the approximate domain classification within the memory chip, in which numeral 7 indicates the memory cell array portion and 8 the peripheral circuit portion controlling the work of the memory cell array. Both the portions 7 and 8 are composed of course of a plurality of circuits consisting of a plurality of memory cells and a plurality of MOS transistors, respectively.

Now, in a memory chip described above, large spike current at the moment of the switch-on of the power supply is produced principally by the following two mechanisms.

Firstly, during a period of time just after the switch-on of the power supply, when the back bias generator circuit doesn't yet work satisfactorily, since the back bias voltage $V_{BB}$ is lower than the normal value (the absolute value is small), the threshold voltage of the MOS transistor composed of the impurity diffusion layers 3d and 3e and the gate electrode 4c, etc. is negative. Due to this fact, spike current arises from the power supply $V_{CC}$ to ground. That is, as indicated in FIG. 1B, the back bias generator circuit doesn't work, until the power supply voltage $V_{CC}$ reaches a certain voltage $V_{crt}$. Consequently, since the voltage $V_{BB}$ is almost 0 V and the threshold voltage of the MOS transistor is negative according to circumstances, spike current arises. These phenomena are described in 1980 ISSCC Digest of Technical Papers, pp. 228–229.

Another production mechanism for spike current is due to capacitor coupling between the power supply and the silicon substrate. This phenomenon has become an important problem, particularly in recent years, because parasitic capacity between the power supply and the substrate increases with increasing packing density of the memory. It is the spike current provoked by the parasitic capacity $C_{PS}$ between the plate electrode 4b and the substrate that has the most important influences. The peak value $I_P$ of the current $I_{CC}$ from the power supply is represented by $$I_P \propto C_{PS} \frac{dV_{CC}}{dt}. \tag{1}$$

When the value of the capacity $C_{PS}$ becomes very great due to the increase in the packing density of the memory, the displacement current between the power supply $V_{CC}$ and the substrate through the capacity $C_{PS}$ also becomes extremely great. The more rapidly the voltage of the power supply rises, the greater $I_P$ is. The two sorts of current described above are observed as spike current at the moment when the power supply is switched-on and at the same time the following phenomenon is produced and further increases spike current. That is, in a DRAM including the back bias generator in the chip, since the driving capability of the back bias generator is low by nature and in addition the back bias generator doesn't work normally just after the switch-on of the power supply, the substrate 1 is almost in a floating state. Consequently, when current flows through the capacity $C_{PS}$, the voltage $V_{BB}$ rises in the positive direction, as indicated by a broken line in FIG. 1B. As the result the threshold voltage of the MOS transistor stated above is displaced in the negative direction, which produces at the same time the following phenomenon giving rise to a still more important problem. That is, n+ type diffusion layers, such as 3c and 3e, and the p-conductivity type substrate 1 are forward biased and parasitic bipolar transistors as indicated by $Q_1$ and $Q_2$ act as active devices. In this case, currents as indicated by $I_{Q1}$ and $I_{Q2}$ flow, which increases further the spike current in addition to the displacement current described above. That is, the current produced by the capacity $C_{PS}$ is the base current therefor. Consequently, the current flowing between collector and emitter is $h_{fe}$ (current gain) times as large as the base current and depends considerably on $h_{fe}$ of the parasitic transistors $Q_1$, $Q_2$, etc. Since $Q_1$ and $Q_2$ are lateral type transistors in this case, this value ($h_{fe}$) is relatively small with respect to usual transistors. But $h_{fe}$ becomes larger and the problem of the spike current becomes more important, as the distance between diffusion layers acting as emitter and collector becomes smaller with increasing packing density.

Although the production mechanism of the spike current at the moment of the switch-on of the power supply has been explained above by using a DRAM as an example, the problem of the spike current described above is more important for the case of DRAM, in which both a p-channel MOS transistor and a n-channel MOS transistor are used as principal constituent elements, so-called CMOS type.

At the moment of the switch-off of the power source the back bias varies further toward negative by the capacitor coupling, as indicated in FIG. 1B. However, this does not particularly influence the spike current, subject to be treated here. Consequently, in the following figures, waveforms at the moment of the switch-off of the power source and also their explanation will be omitted.

FIG. 2A is a cross-sectional view of the principal part of a CMOS type LSI. The reference numeral 1 indicates a p-conductivity type silicon substrate and 9 represents an n-conductivity type impurity diffusion layer, which is usually called a "well" and in which a p-channel MOS transistor is formed. On the other hand, an n-channel MOS transistor is formed directly in the p-conductivity type silicon substrate 1. Further, there can be cases, in which the silicon substrate is of n-conductivity type; the well is of p-conductivity type; the n-channel MOS transistor is formed in the well; and the p-channel MOS transistor is formed in the substrate. The reference numerals 3f and 3g indicate representatively diffusion layers used as sources or drains of MOS transistors. The former shows an n+ type diffusion layer and the latter indicates a p+ type diffusion layer. Such a structure gives rise to n-p-n type and p-n-p type parasitic bipolar transistors, as indicated by $Q_3$ and $Q_4$, respectively, and to parasitic resistances as indicated by $R_1$ and $R_2$. These are so connected that they are equivalent to a so-called thyristor, as indicated in FIG. 2B. For this reason, once the thyristor goes into the "on" state, layer current flows between the power source $V_{CC}$ and ground, and finally the element breaks down. This is the so-called latch-up phenomenon in the CMOS type semiconductor device, which is described in detail e.g. in 1982 IEDM, Technical Digest, pp. 454–477. Such a thyristor device is made conductive with a trigger current, which is greater than a certain value, flowing through the base of $Q_3$ or $Q_4$. The spike current produced at the moment of the switch-on of the power source stated above acts just as the trigger current and poses an important problem.

It is described in the above-mentioned publication 1980 ISSCC Digest of Technical Papers, pp. 228–229 that among various sorts of spike currents discussed above, those produced by the fact that the threshold voltage of the MOS transistor becomes negative can be reduced to some extent by setting suitable element constants. However, the spike current produced by the capacitor coupling increases more and more with increasing packing density and will be an important problem in the future. In order to resolve this problem, there is known a method by which the potential of the plate electrode 4b in FIG. 1 is changed from $V_{CC}$ to the ground potential. For this purpose it is necessary to dispose a low concentration n-conductivity type layer just below the plate electrode 4b so that the channel 5 is formed, even when the electrode 4b is at ground potential. As a result, since not only a new fabrication step is necessary, but also additional mask alignment tolerance is necessary for the photolithography process, the effective memory cell size is reduced and the chip size should be enlarged. For this reason, essential problems, such as decrease of production yield, rise of price, etc., are produced.

Although, in the above, the spike current produced at the moment of the switch-on of the power source has been explained, there are problems that also occur during normal operation. For example, spike current can be produced by fluctuations of the power source voltage, or voltage fluctuations can be transmitted, e.g. through the plate electrode 4b in FIG. 1A, to the channel 5. This can also give rise to erroneous operation.

SUMMARY OF THE INVENTION

Therefore, an object of this invention is to provide means for resolving the problems of spike current or erroneous operation produced at the moment of the switch-on of the power source or by voltage fluctuations during normal operation, without any additional fabrication steps and with high efficiency, while realizing a high performance and high stability semiconductor device.

According to one aspect of this invention, the circuit portion, which is the origin giving rise to the spike current at the moment of the switch-on of the power source, is driven by an internal power supply generator disposed in the chip. In this way, almost at the same time as the beginning of operation of the back bias generator or after that, said circuit portion is driven and suppresses efficaciously production of the spike current.

BRIEF DESCRIPTION OF THE DRAWINGS

FIG. 4A shows a first embodiment of an internal power supply generator according to the present invention for the arrangement of FIG. 3A, while

FIG. 5A shows another embodiment of an internal power supply generator in accordance with the present invention using charge pumps, while

FIG. 6A shows a modification of the embodiment of FIG. 5A, while

FIG. 7A shows another modification of the embodiment of FIG. 5A, while

FIG. 12A shows a modification of the embodiment of FIG. 11, while

FIG. 13A shows an application of the present invention to a MOS dynamic memory, while

FIG. 16A shows another embodiment of the present invention for use with plate electrodes, while FIG. 16B shows waveforms with regard to FIG. 16A.

FIG. 17A shows a modification of the embodiment of FIG. 16A, wherein a folded data line arrangement is used, while

DESCRIPTION OF THE PREFERRED EMBODIMENTS

Embodiment 1

Figure 3A:
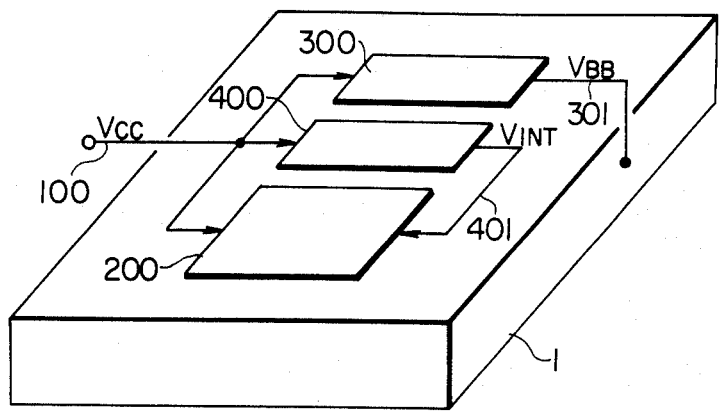
FIG. 3A is a perspective view of a chip showing elements of the invention in block form to explain the basic concept of the invention.

FIG. 3A shows an example for explaining the basic conception of this invention.

Figure 1A:
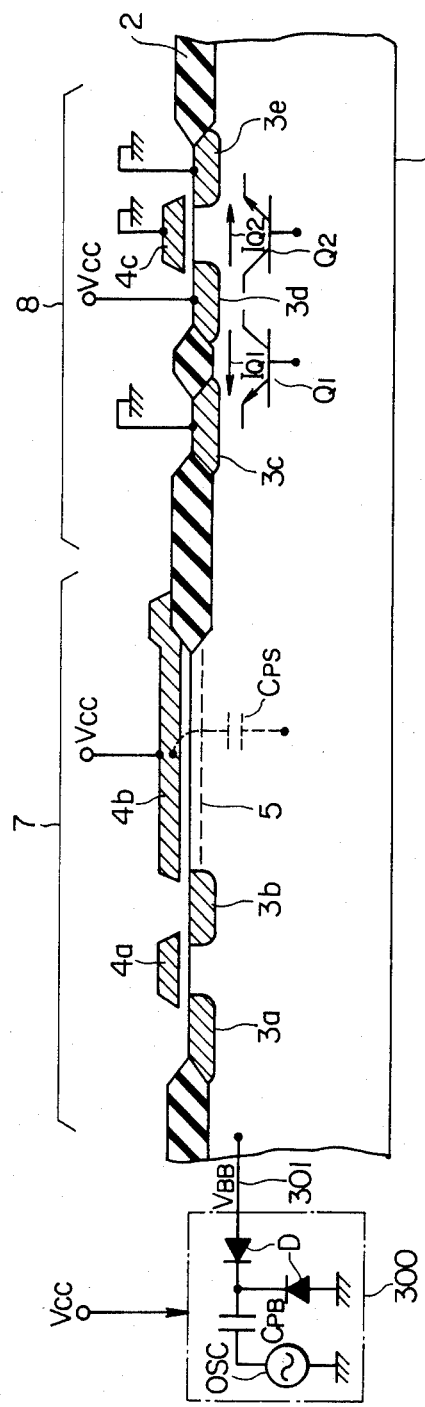
FIGS. 1A to 2B are diagrams for explaining the problems of prior art techniques.

The reference numeral 1 denotes a semiconductor substrate; 200 indicates a main circuit portion of the semiconductor device; 300 indicates a back bias generator generating the back bias $V_{BB}$ and supplying $V_{BB}$ to the substrate 1; and 400 indicates schematically an internal power supply generator generating the internal power supply voltage $V_{INT}$ and supplying the voltage $V_{INT}$ to the main circuit portion 200. These portions are incorporated in a semiconductor substrate or a chip 1. The reference numeral 100 denotes the external power supply voltage $V_{CC}$. Here the main circuit portion can be a memory circuit as indicated in FIG. 1A or various other circuits such as microcomputers, etc., depending on the kind of semiconductor devices.

According to this embodiment, the main circuit portion 200 is driven principally by using the external $V_{CC}$ as the power supply just as for the prior art device, and to the contrary, the circuit portions giving rise to production of the spike current discussed above at the moment of the switch-on of the power supply are driven by the internal power supply voltage $V_{INT}$ so that the spike current is suppressed.

Figure 2A:
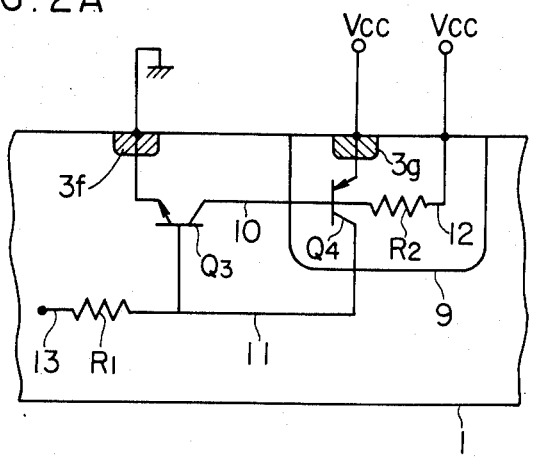
Figure 2B:
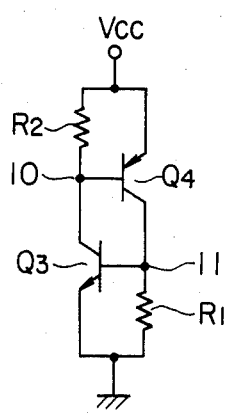
Figure 3B:
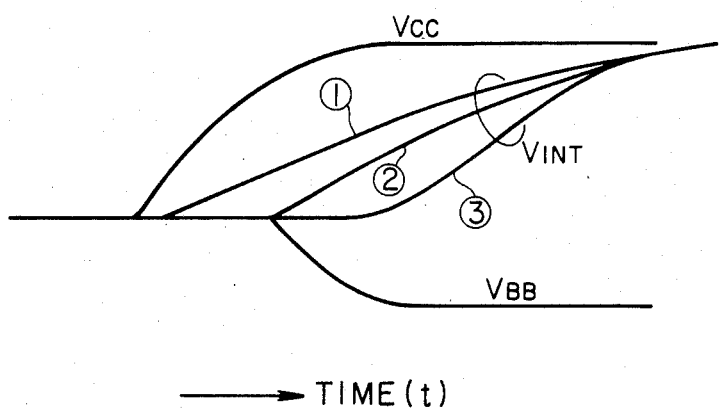
FIG. 3B shows waveforms that can be generated with the arrangement of FIG. 3A.

FIG. 3B is a scheme illustrating the mutual relation among $V_{CC}$, $V_{BB}$ and $V_{INT}$ at the moment of the switch-on of the power supply. The spike current is suppressed by setting $V_{INT}$ with respect to $V_{CC}$ and $V_{BB}$ as indicated by ①to ③ in the figure. At first, in ①, the spike current is suppressed by slowing down the rise of $V_{INT}$ at the moment of the switch-on of the power supply so that the current due to the capacitor coupling stated above is reduced. That is, it is utilized that, as indicated by Eq. (1), the longer the rise time of the power supply voltage is, the smaller the spike current is. In ②, the spike current is suppressed by suppressing fluctuations of the back bias so that it is never positive, more precisely in the extent that the parasitic bipolar transistors or the thyristor explained by referring to FIG. 1A, FIG. 2A, etc. are not switched-on, by synchronizing approximately the beginning of the rise of $V_{INT}$ with the beginning of the fall of $V_{BB}$ so that, even if the spike current by displacement current due to the capacitor coupling flows, it takes place at the same time as the fall of $V_{BB}$. In ③, the effect described in ② is brought to perfection by retarding further the beginning of the rise of $V_{INT}$.

As mentioned above, according to this embodiment, it is intended to reduce the spike current by increasing the rise time of the driving voltage for the circuit portion giving rise to production of the spike current at the moment of the switching-on of the power supply or by retarding the beginning of the rise. It is also possible to control at the same time both the rise of $V_{INT}$ and the beginning of the rise.

As explained above, according to this invention, it is possible to suppress efficaciously the spike current at the moment of the switch-on of the power supply.

Figure 4A:
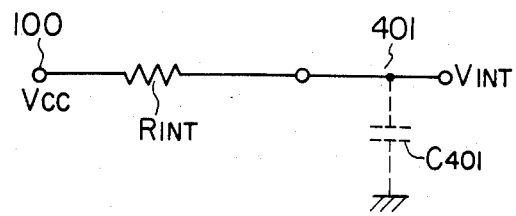
Figure 4B:
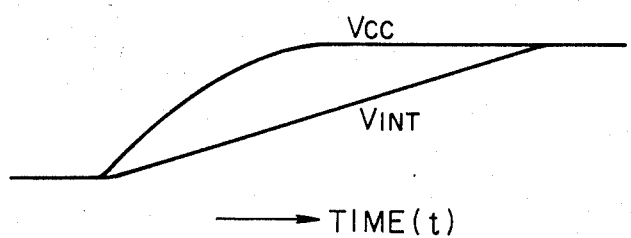
FIG. 4B shows waveforms for FIG. 4A.

FIG. 4A is a circuit schematic for an example of internal power supply generators realizing the characteristics as described above. In the figure, $R_{INT}$ represents a resistance and $C_{401}$ represents a capacity, which arises parasitically at the output 401 of this circuit. According to this embodiment, $V_{INT}$ rises with a time constant determined by $R_{INT}$ and $C_{401}$ and $V_{INT}$ having a rise time longer than $V_{CC}$ can be realized. That is, the characteristics shown by ① in FIG. 3A can be realized by the method of this embodiment. In this way, the spike current described above can be suppressed efficaciously. Further, although a parasitic capacity $C_{401}$ is utilized, it is of course possible to add a separate capacitor, in the case where the parasitic capacity $C_{401}$ is small.

Figure 5A:
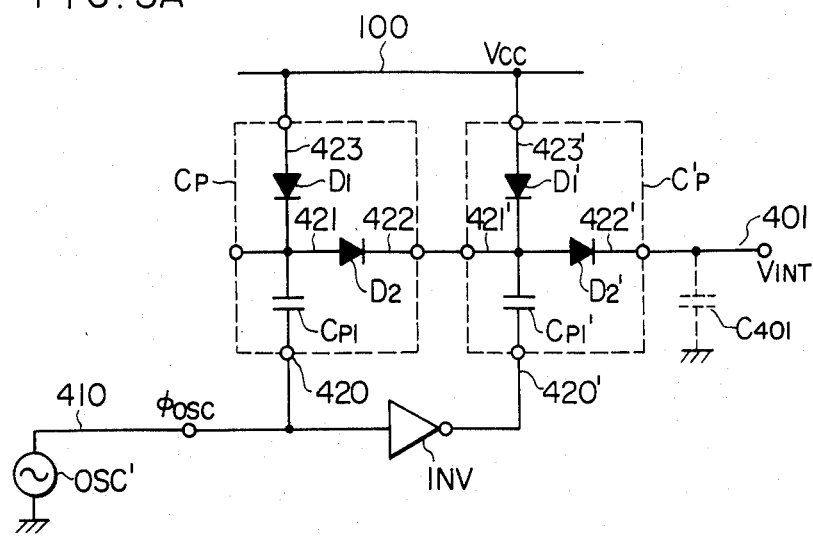

FIG. 5A shows another embodiment of internal power supply generators, in which a charge pumping circuit is used for the generator of $V_{INT}$.

Figure 5B:
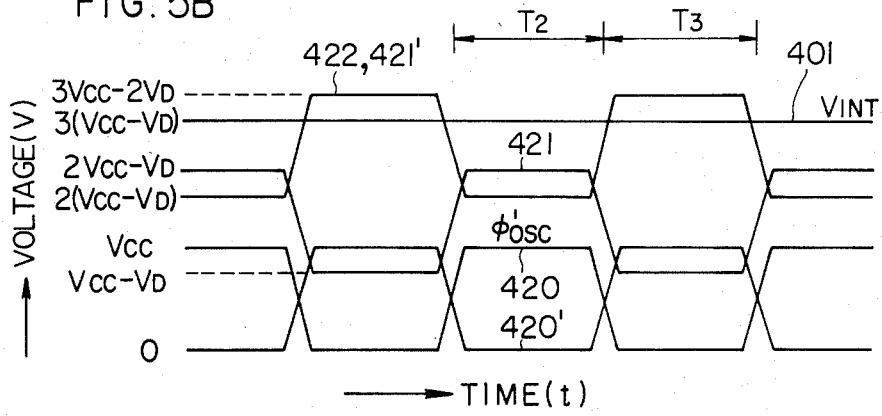
FIGS. 5B and 5C show waveforms regarding FIG. 5A.
Figure 5C:
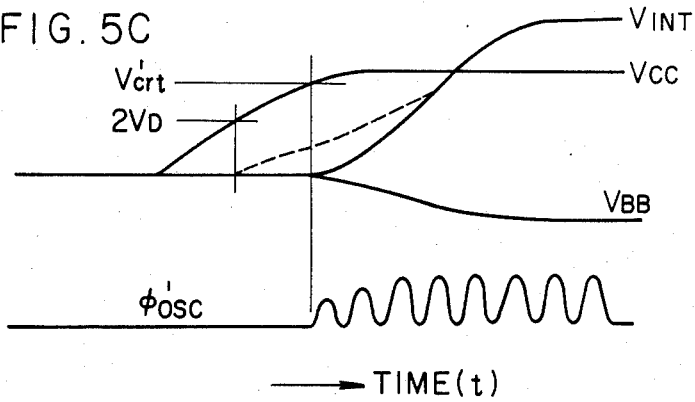

In the figure, $C_P$ and $C_{P'}$ represent circuits, which are units constituting the charge pumping circuit. OSC' is a signal source for the charge pumping and constituted e.g. by a self-starting type ring oscillator circuit as stated above. INV is an inverter circuit for forming inverted signals. $C_{PI}$ and $C_{PI}'$ represent capacitors for the charge pumping; $D_1$, $D_1'$, $D_2$ and $D_2'$ represent rectifying diodes. FIG. 5B shows the working mode in the stationary working state. As indicated in the figure, when a pulse $\phi'_{OSC}$ having an amplitude $V_{CC}$ coming from the oscillator OSC' in the chip rises from 0 V to $V_{CC}$ (T$_2$), the node 421, which has been previously charged to $V_{CC}-V_D$ ($V_D$ is a forward voltage of a diode) through the diode $D_1$, is increased to $2 V_{CC}-V_D$. With this rise in voltage, the voltage of the nodes 422 and 421' decreases by $V_D$ due to the diode $D_2$ and thus it becomes $2(V_{CC}-V_D)$. Then, the pulse $\phi'_{OSC}$ falls to 0 V, and when the voltage at the node 420' rises to $V_{CC}$ (T$_3$), the voltage at the node 421' is further risen to $3V_{CC}-2V_D$. Consequently, the voltage at the node 422', i.e. $V_{INT}$ decreases by $V_D$ due to the diode $D_2'$ and becomes $3(V_{CC}-V_D)$. By repeating this cycle many times, a continuous voltage $3(V_{CC}-V_D)$ can be obtained at the output 401. Although in the above working mode in the stationary state has been described, it works at the moment of the switch-on of the power supply, as illustrated in FIG. 5C.

$V_{CC}$ rises by the switch-on of the power supply, but the oscillator OSC' doesn't work immediately as explained referring to FIG. 1A and begins to work at the moment when $V_{CC}$ reaches a certain voltage $V'_{crt}$. Thus, the oscillation signal $\phi'_{OSC}$ is outputted. Consequently, $V_{INT}$ rises after the passage of a certain period of time from the switch-on of the power supply as indicated in FIG. 5C. At this moment the operation beginning voltage of the oscillator OSC' is approximately equal to that of the oscillator OSC in FIG. 1A (or it can be so designed that they are approximately equal). Therefore $V_{INT}$ and $V_{BB}$ rise approximately at the same time (precisely speaking, $V_{BB}$ falls down), as indicated in FIG. 5C. That is, according to this embodiment, the characteristics as shown by ② indicated in FIG. 3B can be realized. In this way, the spike current produced at the moment of the switch-on of the power supply is suppressed efficaciously. Furthermore, according to this embodiment, the rising speed $t_{hINT}$ of $V_{INT}$ can be represented approximately by $$t_{hINT} \propto \{(C_{PI}+C_{PI}')f'_{OSC}\}^{-1}, \quad (2)$$

where $f'_{OSC}$ represents the oscillation frequency of the oscillator OSC'. In this way, the driving capability as the power supply can be controlled by $C_{PI}$, $C_{PI}'$ and $f'_{OSC}$. Consequently, it is possible to control $t_{hINT}$ by selecting suitably $C_{PI}$, $C_{PI}'$ and $f'_{OSC}$. Thus, it can be intended to suppress further the spike current, e.g. by increasing $t_{hINT}$.

In addition, in this embodiment, the value of $V_{INT}$ is in principle $3(V_{CC}-V_D)$, but it is controlled by changing the number of connected charge pumping circuits $C_P$. That is, n being the number of connected $C_{PI}$, $V_{INT}$ is represented by $$V_{INT}=(n+1)(V_{CC}-V_D). \quad (3)$$

Thus, $V_{INT}$ can be also controlled by varying n. These details are described together with the oscillator OSC' and the circuit INV in U.S. Ser. No. 562,961 (based on Japanese Patent Application No. 220083/82) corresponding to Japanese Patent Application Laid-Open No. 11514/84.

In the above embodiments, $V_{INT}$ begins to rise at the moment when $V_{CC}$ exceeds $V'_{crt}$. However, in the case where $V'_{crt}$ is greater than $2 V_D$, the diodes $D_1'$ and $D_2'$ FIG. 5A are switched-on, before the charge pumping operation begins, and $V_{INT}$ can rise as indicated by a broken line in FIG. 5C. Even if this takes place, the beginning of the rise of $V_{INT}$ is later than that of $V_{CC}$ and further its rise time can be controlled according to Eq. (2) stated above. Consequently, the spike current can be controlled, but in order to further complete the suppression of the spike current, the following embodiment is useful.

Figure 6A:
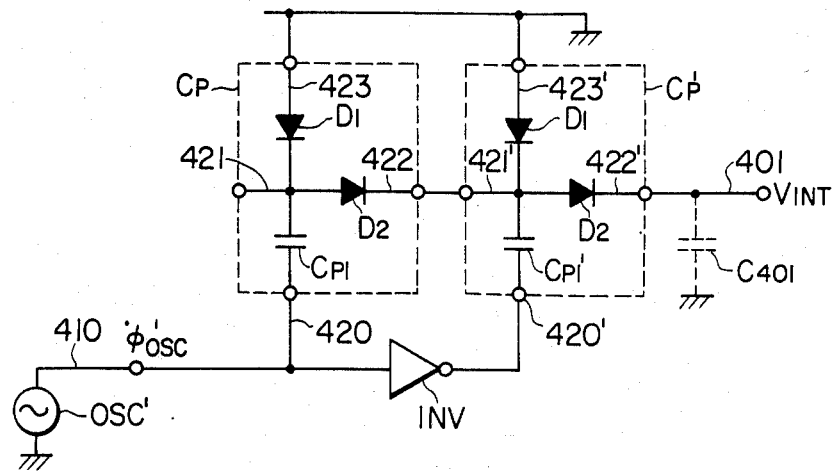
Figure 6B:
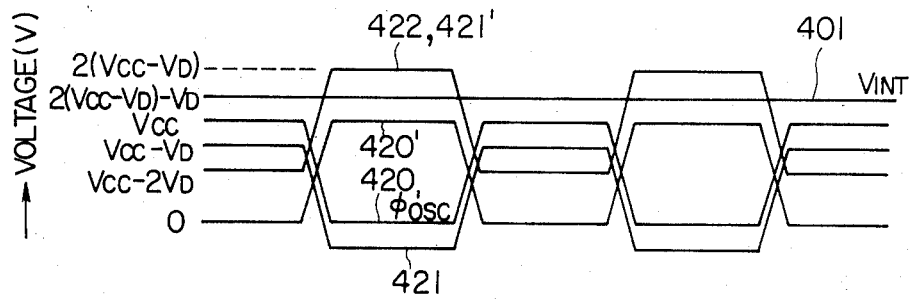
FIGS. 6B and 6C show waveforms regarding FIG. 6A.
Figure 6C:
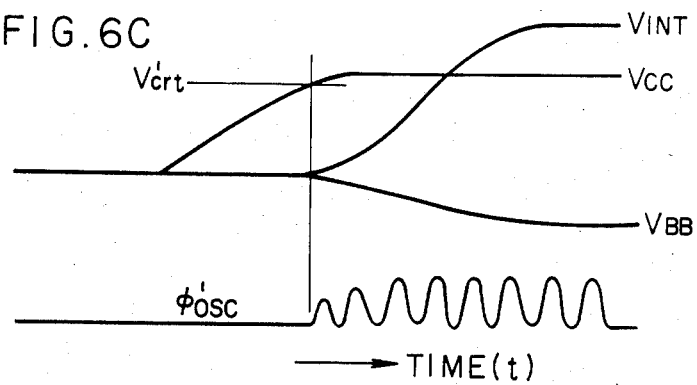

FIG. 6A shows an example which realizes the characteristics mentioned above. This embodiment differs from that indicated in FIG. 5A in that the nodes 423 and 423' of the charge pumping unit circuits $C_P$ and $C_P'$, respectively, are grounded (in FIG. 5A they are connected with $V_{CC}$). Consequently the operating waveforms during the normal operation of this embodiment can be represented as indicated in FIG. 6B. The working principle of this embodiment is identical to that of the embodiment indicated in FIG. 5B, but since it works with the reference potential of 0 V, the output $V_{INT}$ is $2(V_{CC}-V_D)-V_D$. This value is lower than that of the embodiment indicated in FIG. 5A. But, in the case where a higher voltage is required, the output voltage may be increased by increasing the number of connected charge pumping circuits, as stated above. For this embodiment, n being the number of the circuis, the value of $V_{INT}$ can be represented as follows:

$$V_{INT}=n(V_{CC}-V_D)-V_D. \quad (4)$$

According to this embodiment, $V_{INT}$ is not outputted, unless the oscillator OSC' begins to operation. Thus, it is possible to realize the characteristics that $V_{INT}$ begins to rise approximately at the same time as $V_{BB}$ in the same manner as ② in FIG. 3B, and therefore to suppress efficaciously the spike current.

Figure 7A:
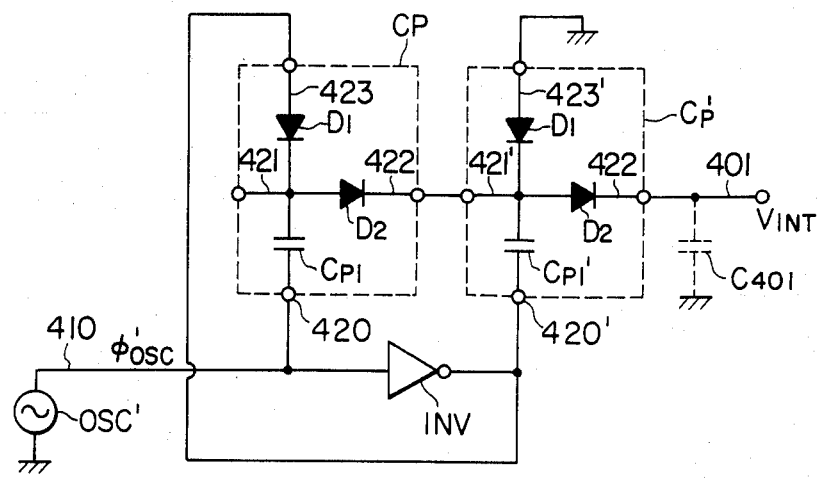
Figure 7B:
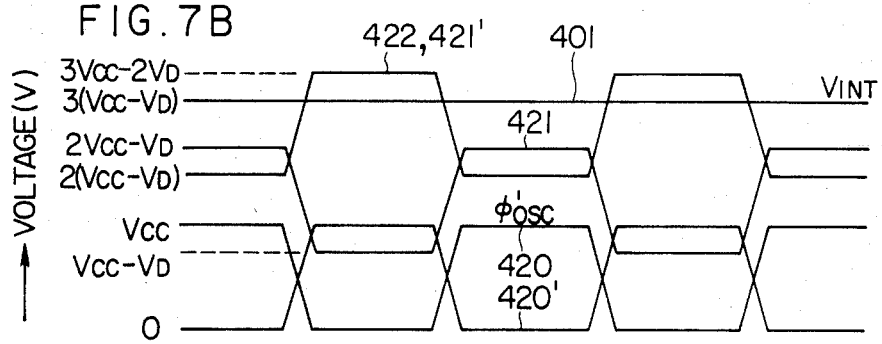
FIGS. 7B and 7C show waveforms regarding FIG. 7A.
Figure 7C:
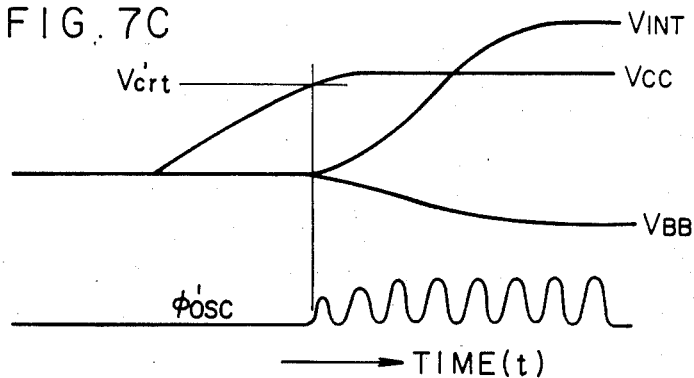

FIG. 7A shows another embodiment of $V_{INT}$ generation circuits, which permits obtaining the same output voltage as that of FIG. 5A, while using the same ground circuit as that indicated in FIG. 6A, i.e. making it work with the reference voltage of 0 V. As seen in the figure, its circuit construction differs from that of the embodiment indicated in FIG. 6A in that the INV output is applied to the terminal 423. The operating waveforms during the normal operation of this embodiment can be represented as indicated in FIG. 7B and at the output terminal a voltage of $3(V_{CC}-V_D)$ is obtained just as for the embodiment indicated in FIG. 5A. The relationship between the number of circuits n of the charge pumping unit circuits $C_P$ and the output voltage $V_{INT}$ is completely the same as that represented by Eq. (3).

According to this embodiment, in the same manner as that of the embodiment indicated in FIG. 6A, $V_{INT}$ is not outputted, unless the oscillator OSC' begins to work, and furthermore it is possible to obtain an output voltage as high as that of the embodiment indicated in FIG. 5A. In the case where the output voltage is higher than that required, it may be lowered by removing the charge pumping unit circuit $C_P'$ so that the number of stages of the charge pumping circuit is reduced, as clearly seen from Eq. (3). According to this embodiment it is possible to suppress more efficaciously the spike current at the moment of the switch-on of the power supply.

Thus, it is possible to suppress considerably the spike current produced at the moment of the switch-on of the power supply by utilizing each of the embodiments indicated in FIGS. 4A-7A, as described above, as the internal power supply generator 400 in FIG. 3A.

Figure 8:
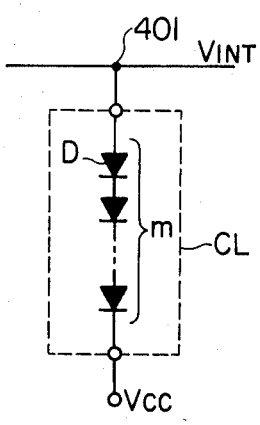
FIGS. 8 and 9 show clamp circuits which can be used in the present invention.
Figure 9:
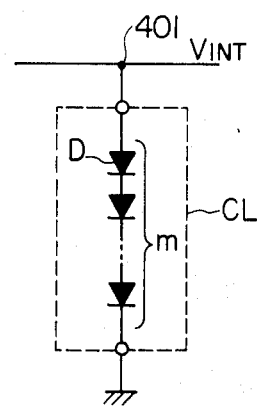

It has been already stated in the embodiments shown in FIGS. 5A and 6A that the value of $V_{INT}$ can be controlled by choosing the number of connected charge pumping circuits. When still finer control is required, the embodiments as indicated in FIGS. 8 and 9 may be utilized. For these embodiments, a clamp circuit $C_L$ consisting of diodes D is inserted at the output terminal 401 of the internal power supply generator 400. That is, it is inserted in FIG. 8 between the terminal and $V_{CC}$ and in FIG. 9 between the terminal and ground. Then, the value of $V_{INT}$ can be represented as follows: when $V_D$ denotes the forward voltage of the diodes and m indicates the number of the connected diodes, in the case of FIG. 8;

$$V_{INT} = V_{CC} + mV_D. \quad (5)$$

and in the case of FIG. 9;

$$V_{INT} = mV_D. \quad (6)$$

Consequently, it is possible to set arbitrarily the value of $V_{INT}$ by varying m.

Although, in the embodiment described above, the outline of this invention has been explained by using diodes as constituent elements of the charge pumping circuits, etc., the diode D can be replaced by an MOS transistor $Q_M$ or by a bipolar transistor $Q_B$ as it is. Of course, in this case, the forward voltage of the diode $V_D$, which has been used in the figures for explanation or the equations already mentioned, should be replaced in the case of the MOS transistor by its threshold voltage $V_T$ and in the case of the bipolar transistor by its base-emitter voltage $V_{BE}$.

In the embodiments described above, it has been stated that, for the reduction of the spike current, it is desirable to synchronize the point of time of the rise or the rise time of the internal voltage $V_{INT}$ at the moment of the switch-on of the power supply with that of the back bias $V_{BB}$. This can be naturally achieved according to the embodiments described above. In the following embodiments, to this end, a charge pumping signal is used in common of the production of both $V_{INT}$ and $V_{BB}$.

Figure 1B:
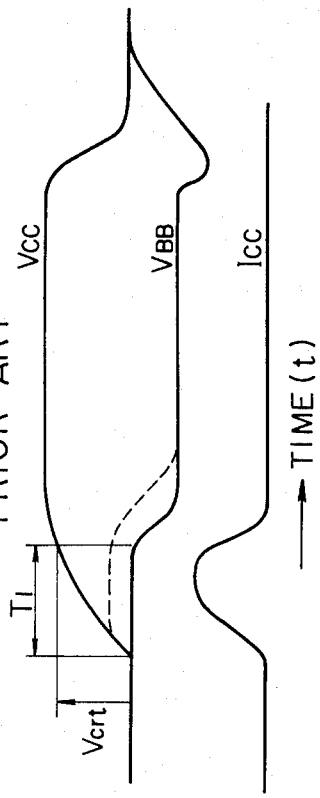
Figure 10:
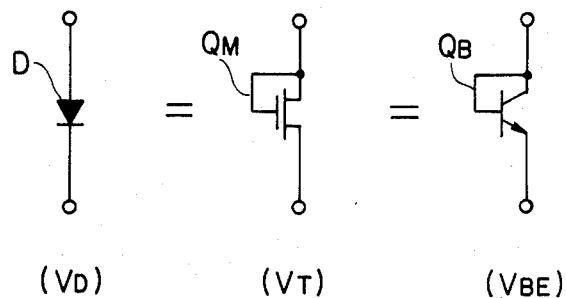
FIG. 10 shows alternative possibilities for forming diodes in the present invention.
Figure 11:
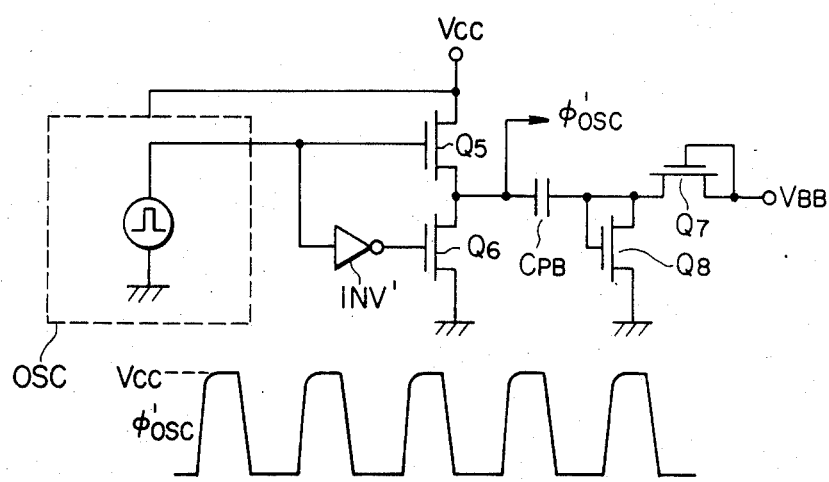
FIG. 11 shows another embodiment of the present invention using a ring oscillator in common for producing $V_{INT}$ and $V_{BB}$.

FIG. 11 shows an embodiment therefor, where the oscillation output of the oscillator OSC consisting of a ring oscillator, etc. is used in common for the production of $V_{BB}$ and $V_{INT}$. In the figure INV' indicates an inverter circuit, and $Q_5$ and $Q_6$ represent MOS transistors, which constitute a push-pull type buffer circuit. $C_{PB}$, and $Q_7$, $Q_8$ are the pumping capacitor for the production of the back bias and MOS transistors used as a rectifier, respectively. This is an embodiment, in which the diodes in the circuit indicated in FIG. 1 are replaced by MOS transistors. This replacement has been explained, referring to FIG. 10. In this embodiment the output of the buffer circuit is used as the charge pumping signal $\phi'_{OSC}$ for the production of $V_{INT}$ in the embodiments indicated in FIGS. 5A-7A. As the result, even if the oscillation starting voltage, etc. vary differently depending on utilization conditions, fabrication conditions, etc., $V_{BB}$ and $V_{INT}$ rise almost at the same time or synchronously. Consequently it is possible to keep the mutual relation between $V_{INT}$ and $V_{BB}$ always constant and thus to effect more efficaciously the suppression of the spike current at the moment of the switch-on of the power source.

Figure 12A:
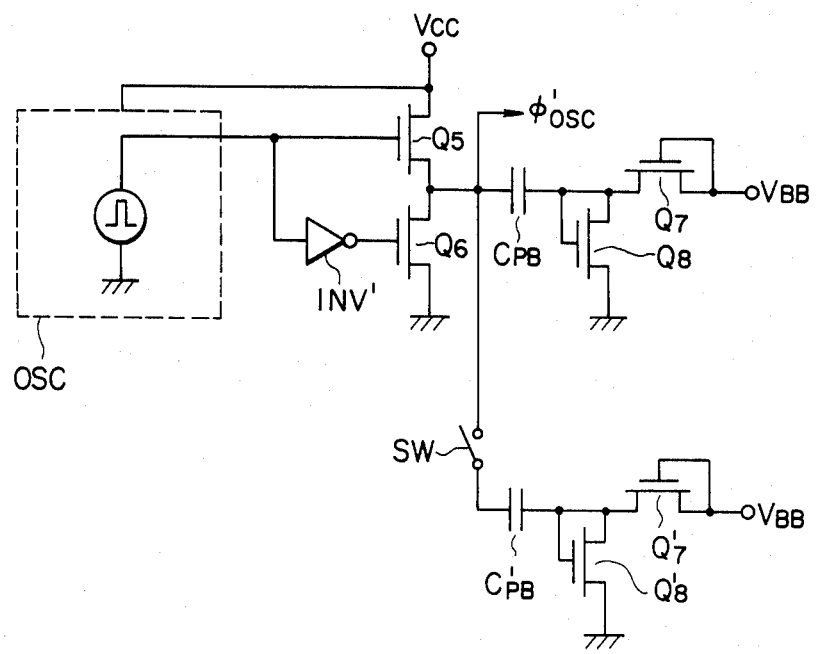
Figure 12B:
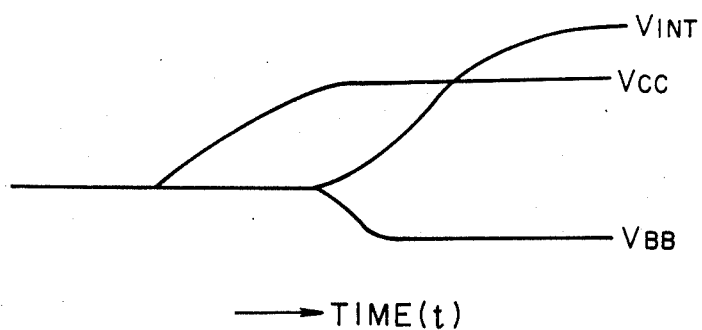
FIG. 12B shows waveforms regarding FIG. 12A.

FIG. 12A shows still another embodiment, in which $C_{PB}'$, $Q_7'$ and $Q_8'$ are further added to the embodiment indicated in FIG. 11 to increase the driving capability of the $V_{BB}$ generation circuit. The $V_{INT}$ generation circuit is driven by the output of a buffer circuit consisting of MOS transistors $Q_5$ and $Q_6$ just as for the preceding embodiment. According to this embodiment, the fall time of $V_{BB}$ at the moment of the switch-on of the power supply becomes shorter, and thus it is possible to set $V_{BB}$ to a predetermined value, before $V_{INT}$ rises sufficiently, which improves the effect stated referring to FIG. 12A. Further, although separate charge pumping circuits are added here in order to differentiate the driving capability of $V_{INT}$ and that of $V_{BB}$, the driving capability can be differentiated by differentiating e.g. the magnitude of the pumping capacity, utilizing the relationship represented by Eq. (2). Furthermore, it is also possible to differentiate the driving capability of $V_{INT}$ and that of $V_{BB}$, by counting down the frequency by means of a counter and using it as $\phi'_{OSC}$.

Furthermore, although in this embodiment $C_{PB}'$, $Q_7'$ and $Q_8'$ are added in order to increase the driving capability of $V_{BB}$, since these function mainly at the moment of the switch-on of the power supply, it is also possible to switch-off the switch SW during their normal operation and to stop their operation, in order to reduce electric power consumption. Since it is sufficient that the switch SW has the function to stop their operation, it can be mounted at any location where it can have the same function. For example, it can be mounted either between $C_{PB}'$ and $Q_7'$, between $Q_8'$ and ground, or between $Q_7'$ and $V_{BB}$. Further, the switch can be constructed by any constituent means, e.g. by MOS transistors. Still further, its on-off control can be effected by any means, e.g. by switching-off at the moment when it is detected that the power supply voltage $V_{CC}$ or $V_{INT}$ has reached a predetermined value. It is also conceivable to on-off control it by utilizing that the threshold voltage of the MOS transistor varies depending on the value of $V_{BB}$. These concrete constructions therefor are described e.g. in 1979 ISSCC Digest of Technical Papers, pp. 142-143.

Furthermore, although the output signal of the oscillator OSC used for every charge pumping circuit in common is taken out through the buffer circuit consisting of the transistors $Q_5$ and $Q_6$, the basic idea of each of the embodiments is that the oscillator OSC is used for $V_{INT}$ and $V_{BB}$ in common, and the signal can be taken out at any location. For example, the output of the oscillator OSC can be supplied to each of the charge pumping circuits by dividing the output directly. In this case, buffer circuits can be added, if necessary.

In the above, some embodiments concerning the production method for $V_{INT}$ and $V_{BB}$ have been described. Hereinbelow some examples, in which these are applied to concrete semiconductor devices, will be explained.

Figure 13A:
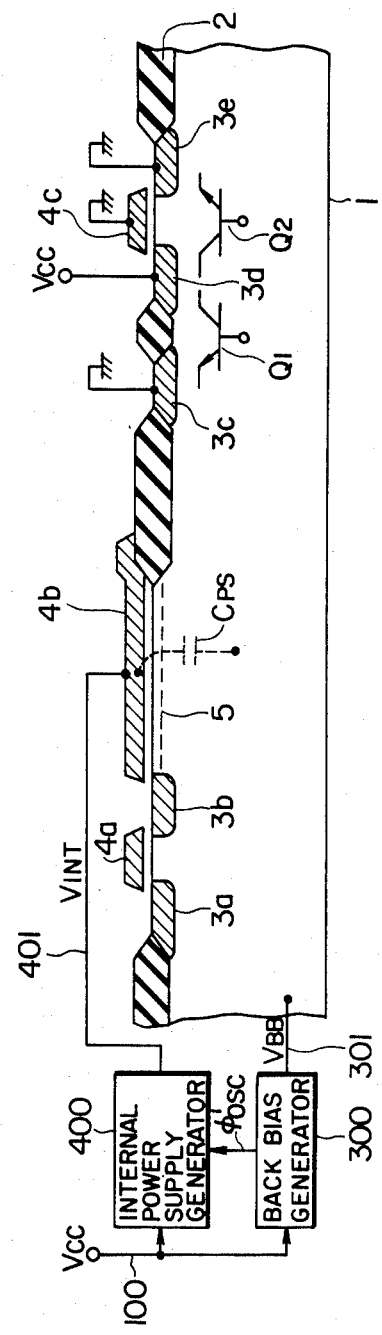

FIG. 13A shows an example, in which, in the MOS dynamic memory indicated in FIG. 1A, the plate electrode 4b is driven by the internal voltage $V_{INT}$ in order to suppress the effect of the parasitic capacity $C_{PS}$ between the plate electrode 4b of the storage capacitor and the substrate, which has specifically important influences on the production of the spike current at the moment of the switch-on of the power supply. As a prior art technique, by which an internally produced voltage is applied to the plate electrode in the same way, is known "IEEE Journal of Solid-State Circuits, Vol. SC-15, No. 5, Oct. 1980, pp. 839-846". However, in this publication, the spike current at the moment of the switch-on of the power supply is not taken into account, and the relation between $V_{INT}$ and $V_{BB}$, which is specifically important for this invention, is not mentioned at all. In this embodiment, for the $V_{INT}$ production circuit is used the method, by which the oscillation signal for the $V_{BB}$ production circuit is used for it in common, as indicated in FIG. 7A. Of course the other types of circuits indicated in FIGS. 4A–6A or their combinations can be applied as they are.

Figure 13B:
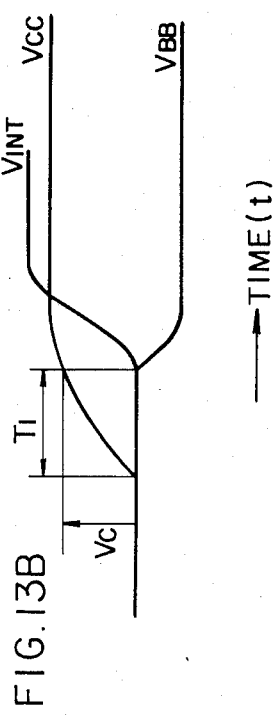
FIG. 13B shows waveforms regarding FIG. 13A.

According to this embodiment, as indicated in FIG. 13B, $V_{BB}$ and $V_{INT}$ rise approximately at the same time. As the result it is possible to suppress considerably the spike current, because $V_{BB}$ doesn't rise so strongly that the bipolar transistors $Q_1$ and $Q_2$ are switched on, even if a displacement current flows through $C_{PS}$, as stated above. In addition, since the rise time of $V_{INT}$ can be sufficiently long with respect to that of $V_{CC}$ as indicated by Eq. (2), the displacement current itself can be reduced considerably.

Figure 14:
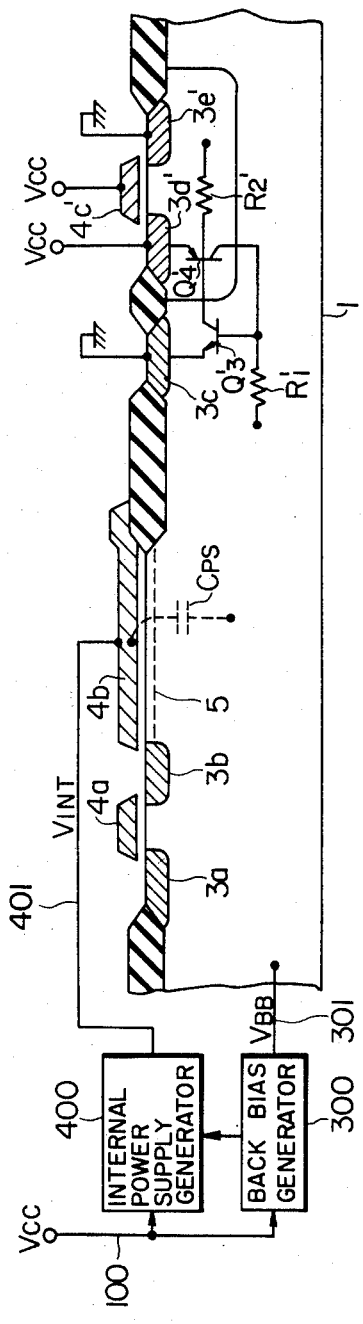
FIG. 14 shows an application of the present invention to a CMOS dynamic DRAM.

FIG. 14 shows an example in which this invention is applied to or CMOS type DRAM and $V_{INT}$ is supplied to the plate electrode $4b$ in the same way as in the embodiment indicated in FIG. 13A.

In the figure, an n-well type CMOS is shown as an example just as for FIG. 2A. The reference numeral $9'$ designates an n-well and $3d'$ and $3e'$ represent p+ type diffusion layers, which constitute a p-channel type MOS transistor together with the gate electrode $4c'$.

In this embodiment, since variations of $V_{BB}$ in the positive direction at the moment of the switch-on of the power supply can be reduced just as for the embodiment indicated in FIG. 13A, it is possible to resolve the problem that parasitic bipolar transistors, etc. represented by $Q_3'$, $Q_4'$, etc. give rise to latch-up phenomena, to suppress the spike current and to resolve the problem of break down of device due to it.

Further, although in this embodiment an n-well type CMOS has been explained as an example, this invention can be applied equally well to a p-well type CMOS only by inverting the relation in polarity.

Figure 15:
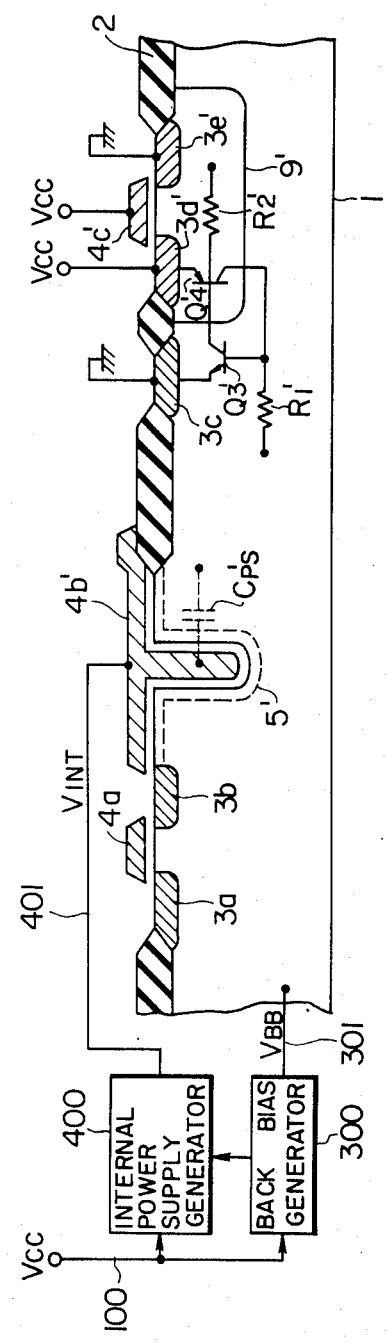
FIG. 15 shows an application of the present invention with a groove type memory cell arrangement.

FIG. 15 shows another embodiment, in which a groove type capacitor is used as a storage capacitor of the memory cell in the embodiment in FIG. 14. The capacitor is formed at the side wall for a groove formed in the Si substrate. In this embodiment also the same effect as that of the embodiment indicated in FIG. 14 can be obtained and at the same time, in addition, this embodiment has the following advantages. It has been already stated that in order to eliminate the spike current through $C_{PS}'$, there is known, other than the method according to this invention, a method by which the potential of the plate electrode $4b'$ is the ground potential, although it is accompanied by problems such as more or less increase in fabrication step, etc. For this purpose it is necessary to form an n-conductivity type impurity diffusion layer along the side surface for the groove so that a channel $5'$ is always formed, even if the plate electrode $4'$ is grounded. However, it is very difficult to realize it in such a structure. According to this embodiment, it is possible to suppress efficaciously the spike current at the moment of the switch-on of the power supply, even in the case where is used a memory cell, where it is very difficult to ground the plate electrode, as described above.

FIG. 16A shows another embodiment for making this invention more efficacious, which is suitable for reducing fluctuations of $V_{INT}$ applied to the plate electrode due to the work of the memory.

In the figure D, $\overline{D}$, D' and $\overline{D}'$ represent data lines and W a word line. Memory cells MC are arranged on their cross points. As the memory cells MC, e.g. the memory cells indicated in FIGS. 13A–15A can be used. In this case the diffusion layer $3a$ is connected to the data line and the gate electrode $4a$ to the word line. The plate electrodes $4b$ or $4b'$ are distributed as common plate electrodes on the whole array of memory cells between memory cells arranged in a two-dimensional matrix form and designated here by PL, $\overline{PL}$, PL' and $\overline{PL}'$. Here data lines D, $\overline{D}$ and D', $\overline{D}'$ form respectively a pair and read out small signals appearing on D, $\overline{D}$ and D', $\overline{D}'$ from memory cells MC are differentially amplified by means of sense amplifiers disposed each at the middle point between two columns of memory cells. Thus this embodiment indicates a case utilizing the so-called open data (bit) line arrangement, in which two data lines forming a pair are located separately, right and left. This arrangement of memory cells is described in detail in IEEPROC., Vol. 130, pt. I, No. 3 June 1938, pp. 127–135.

In such a memory, since there exists parasitic capacity $C_{DP}$ between the data line and the plate and a number of data lines work at once, the plate voltage varies, when they work. In particular, in the case where the plate electrode is driven by $V_{INT}$ produced internally as it is so according to this invention, since the driving capability of the $V_{INT}$ production circuit is small, variations of the plate voltage are great. These variations give rise to problems, such as erroneous work of the memory, etc.

For this reason, in this embodiment, a switch SW' is inserted between the $V_{INT}$ production circuit 400 and the plate electrode, which is switched off, when the voltage applied to the plate electrode varies, so that no noises are produced at the output of the $V_{INT}$ production circuit 400. Supposing that among memory cell arrays only those selected operation, that is, when the memory cells in the memory cell arrays, to which the data lines D, $\overline{D}$ belong, are selected, the memory cell arrays, to which the data line D', $\overline{D}'$ belong, are out of operation, the operation mode of the memory cell will be explained, referring to FIG. 16B. The data lines D–$\overline{D}'$ are previously precharged to $V_{DP}$ and when a signal is applied to the operation line at a point of time $t_w$, the memory cell outputs a small signal on a data line D or $\overline{D}$. At this moment, since the data lines D', $\overline{D}'$ are out of operation, they keep their constant values. Then, when the sense amplifier operates, the small signals on the data line D or $\overline{D}$ are amplified and outputted, to the exterior. After the termination of the memory operator the data line is again precharged to $V_{DP}$. When these data lines operate, the voltage applied to the plate electrode varies. However, according to this embodiment, when the potential of the data lines varies, the switch SW' is switched off. Thus no variations are transmitted to the power supply line 401 and no problems are produced. On the other hand, it can give rise to erroneous work that variations in potential of the plate electrode are great. According to this embodiment, this problem is resolved in the following way.

The memory cell arrays PL, $\overline{PL}$ or PL', $\overline{PL}'$ are connected with each other by a low resistance wire 403 or 403' so that PL and $\overline{PL}$ or PL' and $\overline{PL}'$ are always at a same potential and thus no differential noises are produced in PL, $\overline{PL}$ or PL', $\overline{PL}'$, when small signals coming from memory cells MC are amplified in the sense amplifier SA or SA'. This is important for the open data (bit) line arrangement, in which two data lines forming a pair are coupled by capacity with different plate electrodes. (IEE PROC., Vol. 130, pt. I, No. 3, June 1983, pp. 127–135) Furthermore, according to this embodiment, the low resistance wires 403 and 403' are connected with each other through a wire 402 having similarly a low resistance so that parasitic capacity of the memory cell arrays, which are out of operation, acts as a filter. In this way, reduction of fluctuations in potential of the plate electrode is achieved.

Although, in the above, the effect of the switch SW' has been explained for the case where it is switched-off during memory operation (e.g. during a period between the point of time $t_w$ and the moment when the data line is precharged to $V_{DP}$), various control methods are conceivable. For example, a method may be useful, by which it is switched-off only when the potential of some data lines varies considerably, i.e. during the period of time when some sense amplifiers work, or during a period of time when the data lines are precharged to $V_{DP}$ after the termination of the memory operation. Furthermore, if necessary, it may be possible to adjust the time constant against noises by adding resistances such as $R_3$, $R_4$, etc.

Figure 17A:
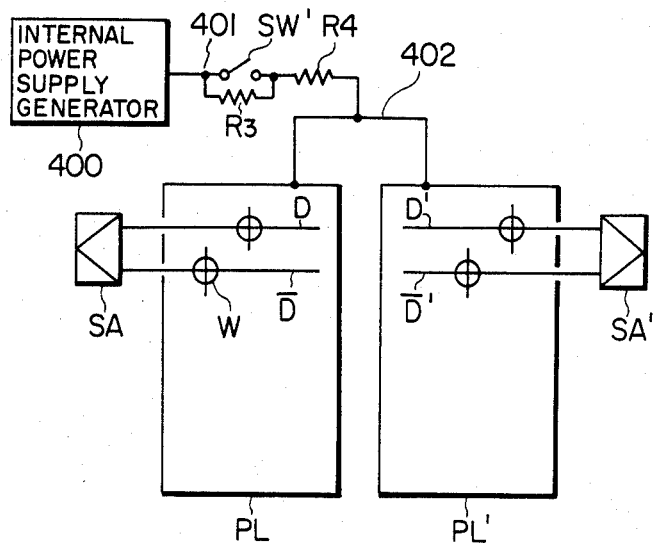
Figure 17B:
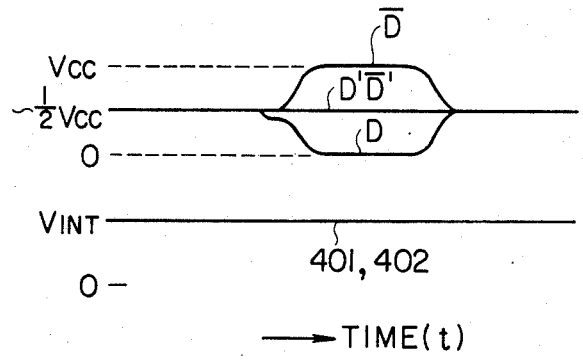
FIG. 17B shows waveforms regarding FIG. 17A.

FIG. 17A shows another more suitable embodiment according to this invention. This embodiment differs from that indicated in FIG. 16A in that the so-called folded data (bit) line arrangement is used, in which two data lines forming a pair are so arranged that they are approximately parallel and that the precharge voltage is approximately equal to ½ of the power supply voltage $V_{CC}$.

In this embodiment, since the data lines D, $\overline{D}$ or D', $\overline{D}'$ forming a pair are coupled by capacity with a same plate PL or PL', it is not necessary to care specifically about differential noises causing trouble for the embodiment indicated in FIG. 16A. Further, in this embodiment, since the data lines are precharged approximately to ½ of $V_{CC}$ and it is so constructed that the two data lines forming a pair work contrariwise to each other, even if there exists coupling capacity between the data lines and the plate electrode, their influences cancel out, what gives rise to an advantage that almost no fluctuations in potential of the plate electrode are produced. Consequently, for such a structure, according to circumstances, even if the output of the internal power supply generator 400 is directly connected without switch SW' with the plate electrode, $V_{INT}$ varies scarcely. Further, although in this embodiment the precharge voltage for the data line was $V_{CC}/2$, it can be of course $V_{CC}$ just as for the embodiment indicated in FIG. 16A or another arbitrary value.

In the above this invention has been explained in detail, referring to some embodiments, but these don't restrict the application domain of this invention at all and various modifications are possible. For example, although examples, in which the application place of the internal voltage is the plate electrode, have been explained, it can be applied to another place, e.g. to the precharge of data lines having large coupling capacity with respect to the substrate, etc. In this way it is possible to suppress more efficaciously the spike current. It is also possible to dispose a current amplification circuit at the output of the internal power supply generator and to increase its driving capability in order to achieve stabilization of the operation. In FIGS. 5A–7A, FIGS. 12A and 13A, etc., although it was shown that $V_{INT}$ is higher than $V_{CC}$, this has no important meaning, but the value of $V_{INT}$ can be varied, according to circumstances, by means of suitable circuits as shown in FIG. 8, FIG. 9, etc. Furthermore, the clamp circuit shown in FIG. 8 and FIG. 9 can be constructed by another well known means, such as zener diode. In addition, in the embodiments indicated in FIGS. 13A–15, although examples using memories, whose principal constituent elements are MOS transistors, were explained, this invention can be applied as well to memories, whose principal constituent elements are bipolar transistors.

Embodiment 2

Figure 18A:
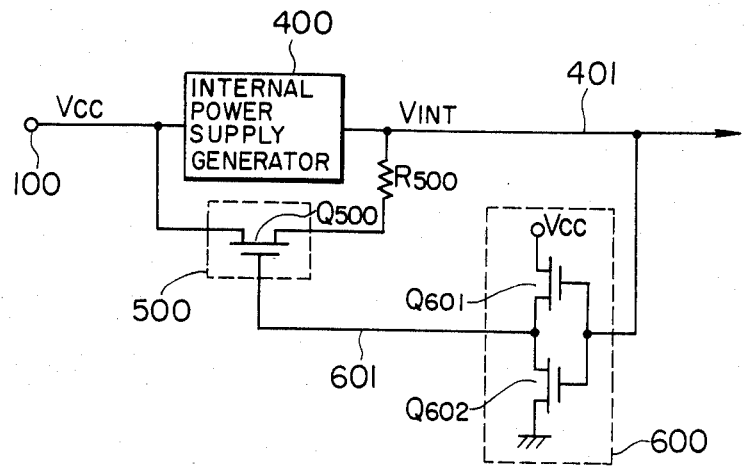
FIGS. 18A and 18B are diagrams showing another embodiment of this invention.

FIG. 18A shows another embodiment suitable to prevent variations of the internal voltage $V_{INT}$. In this embodiment, the plate electrode, etc. are driven by the output of the internal power supply generator only at the moment of the switch-on of the power supply, when the spike current causes trouble and they are driven directly by the external power supply voltage $V_{CC}$ during the succeeding period of stable work. Consequently, in this embodiment, fluctuations of $V_{INT}$ during the normal work don't cause trouble at all.

In the figure, the reference numeral 500 represents a switch means, which is switched-off at the moment of the switch-on of the power supply and switched-on after that. Here is shown an example, in which it is constructed by a p-channel MOS transistor $Q_{500}$, supposing that the whole semiconductor device is composed of CMOS. The reference numeral 600 indicates a means having a function to recognize the state, whether it is just after the switch-on of the power supply or the succeeding period of stabilized work. Here is shown an example, in which the function stated above is realized by detecting that the potential difference between $V_{INT}$ and $V_{CC}$ has become smaller than a predetermined value, and in which it is formed by a CMOS inverter circuit consisting of a p-channel MOS transistor $Q_{601}$ and an n-channel MOS transistor $Q_{602}$. Here the CMOS inverter circuit is so constructed that gm of $Q_{601}$ is sufficiently greater than that of $Q_{602}$ so that "0" (low level) is outputted, when the difference between $V_{CC}$ and $V_{INT}$ becomes smaller approximately than the threshold voltage $V_{TP}$ of $Q_{601}$.

Figure 18B:
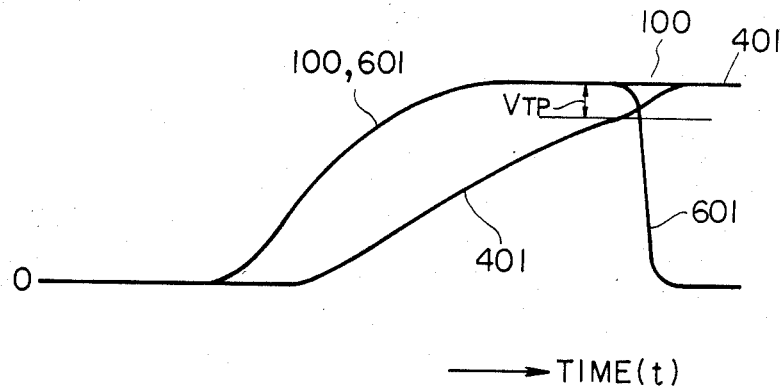

FIG. 18B shows the outline of the operation mode of this circuit. When the power supply voltage 100 is applied, the potential of the line 401 rises later, as already stated. At this moment, since gm of $Q_{601}$ is sufficiently greater than that of $Q_{602}$, the potential of the line 601 rises almost at the same time as the power supply voltage 100. Consequently the transistor $Q_{500}$ is switched-off and the potential of the line 401 rises following the output of the internal power supply generator 400. After that, the potential of the line 401 rises with a determined time constant and the potential of the line 601 falls to the low level (about 0 V), when the difference between the potential of the line 401 and the power supply voltage 100 becomes smaller than the threshold voltage $V_{TP}$ of $Q_{601}$. Thus, the transistor $Q_{500}$ is switched-on. As the result the potential of the line 401 becomes $V_{CC}$ equal to the power supply voltage 100. Consequently it is possible to resolve perfectly the problem that the potential of the line 401 fluctuates during the normal operation.

Although, in this embodiment, the state is detected through the voltage $V_{INT}$ by the detection means 600, this can be effected also by detecting $V_{CC}$, $V_{BB}$ or voltage at other places. In addition, the circuit structure of the detection means 600 is not restricted to that indicated in the figure, but it can be modified in many ways. For example, an operational amplifier, a Schmitt trigger circuit, and other various circuits can be used for this purpose. Furthermore, although here it is detected that the potential difference between $V_{CC}$ and $V_{INT}$ becomes smaller than a predetermined value, the state can be recognized by detecting variations of the absolute value of $V_{INT}$, $V_{CC}$ and $V_{BB}$ and the voltage level to be detected can be suitably selected according to the purpose. Furthermore, although an example was shown, in which the switching means 500 is constructed by a p-channel MOS transistor, it can be constructed by any other sort of elements having a switching function. Further, although an example was shown, in which $V_{INT}$ is $V_{CC}$ in the stationary state, the line 401 can be connected to another voltage generated by an internal circuit having a relatively low output impedance with respect to the internal power supply generator 400. In addition, if necessary, a resistance $R_{500}$ etc. can be inserted in series to the switching means 500.

Embodiment 3

Figure 19:
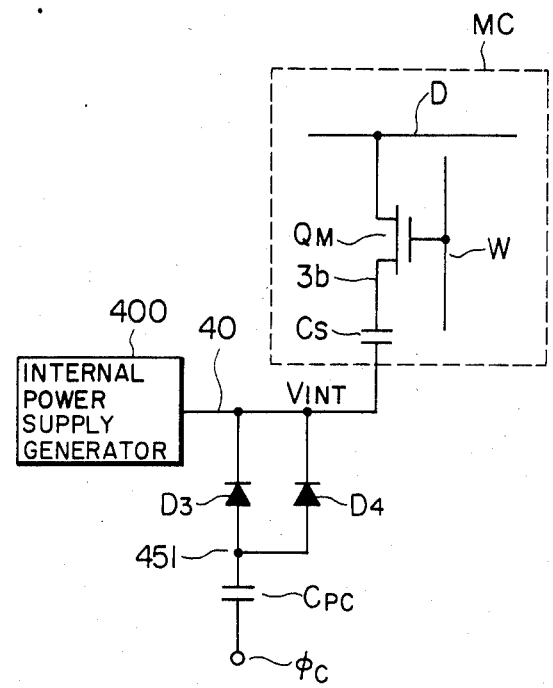
FIGS. 19 to 20B are diagrams showing still other embodiments of this invention.

FIG. 19 shows one embodiment for preventing fluctuations of the voltage of the plate electrode. In the figure, MC shows the equivalent circuit diagram of the memory cell 7 in FIG. 1A, in which D represents a data line; W indicates a word line; $Q_M$ indicates an MOS transistor used as switch; and $C_S$ denotes a storage capacitor. Further, the storage capacitor $C_S$ can be formed e.g. between the plate electrode 4b and the inversion layer 5 in FIG. 1A. Although here only one memory cell MC has been shown, in reality naturally a plurality of memory cells can be disposed. In the embodiment indicated in FIG. 18A, fluctuations of the voltage of the plate electrode were prevented by reducing the equivalent impedance between the plate electrode and $V_{CC}$ controlling the work of the switching means 500. To the contrary, in this embodiment, these fluctuations are prevented by reducing the equivalent impedance with respect to the plate electrode by means of a charge pumping circuit consisting of diodes $D_3$, $D_4$ and a capacity $C_{PC}$. That is, fluctuations of the voltage of the plate electrode are prevented by supplying electric charge to the line 401 while applying a pulse $\phi_C$ thereto approximately in synchronism with the fluctuations of the voltage of the plate electrode and making it perform a charge pumping operation explained referring to FIGS. 5A-5C. The point of time of the application of $\phi_C$ can be conveniently chosen according to the cause giving rise to fluctuations of the voltage of the plate electrode. For example, in the case where the voltage of the plate electrode fluctuates during the work of the sense amplifier or during the precharge operation due to the coupling capacity stated above between the data line and the plate, the above mentioned $\phi_C$ is applied approximately in synchronism with the work of the sense amplifier or the precharge operation or with a frequency, which is higher than (or preferably an integer times as high as) that. Other than the fluctuations described above, the voltage of the plate electrode fluctuates due to the coupling through $C_S$ between the node 3a and the plate electrode in the memory cell. That is, when the voltage of the node 3a fluctuates by the read out or write in operation of the memory, the fluctuations are transmitted through $C_S$ to the plate electrode and as the result the voltage of the plate electrode fluctuates. Consequently, in order to suppress these fluctuations, it is sufficient to apply $\phi_C$ in synchronism with the read out or write in operation stated above or with a frequency, which is higher than (or preferably an integer times as high as) that. For example, in a DRAM of the address multiplex system, i.e. a DRAM of the system, by which the address signals of row and column are inputted through common address input pins in synchronism with clocks of $\overline{RAS}$ and $\overline{CAS}$, respectively, in the case where fluctuations of the voltage of the plate electrode during the usual read out or write in operation cause trouble, it is sufficient to apply $\phi_C$ thereto in synchronism with the $\overline{RAS}$ clock. On the other hand, in the case where fluctuations of the voltage of the plate electrode during the read out or write in operation cause trouble by the page mode, by which the operation is carried out by fixing the row address and by varying only the column address, it is sufficient to apply $\phi_C$ thereto in synchronism with the $\overline{CAS}$ clock. Further, in the case where fluctuations of the voltage of the plate electrode cause trouble by the static column mode (1983 ISSCC Digest of Technical Papers, pp. 64-65), by which the operation is carried out by inputting the colum address, as if it were for the static memory, it is sufficient to detect the variations in address and to apply $\phi_C$ thereto in synchronism with the signals thus obtained, as stated in 1983 ISSCC Digest of Technical Papers, pp. 66-67.

According to the embodiments described above, whatever value $V_{INT}$ has, this invention can be applied and suppress efficaciously fluctuations in voltage of the plate electrode. Further, in the embodiment indicated in FIG. 19, the diodes $D_3$ and $D_4$ can be replaced by various sorts of diodes shown in FIG. 10. In addition, according to circumstances, a terminal of the diode $D_4$ can be connected not with the line 401, but with an external power supply $V_{CC}$ or eliminated. It is also possible, according to circumstances, to remove the diode $D_4$ and the capacitor $C_{PC}$ and to drive directly the line 451.

In the above, some embodiments utilizing on-chip back bias generators for the purpose of the suppression of the spike current of noises have been described. It has been also stated that these embodiments can be applied not only to the production of the application voltage for the plate electrode but also to the production of the precharge voltage for the data line. Hereinbelow still another embodiment suitable to the application of this invention for the purpose of the production of the precharge voltage for the data line will be explained.

In the figure the reference numeral 700 denotes an internal power supply generator producing the precharge voltage $V_{DP}$ for the data line. SW' is the switch for precharging the data line and switched-on during the precharge operation. This switch is constituted usually by an MOS transistor.

Figure 20A:
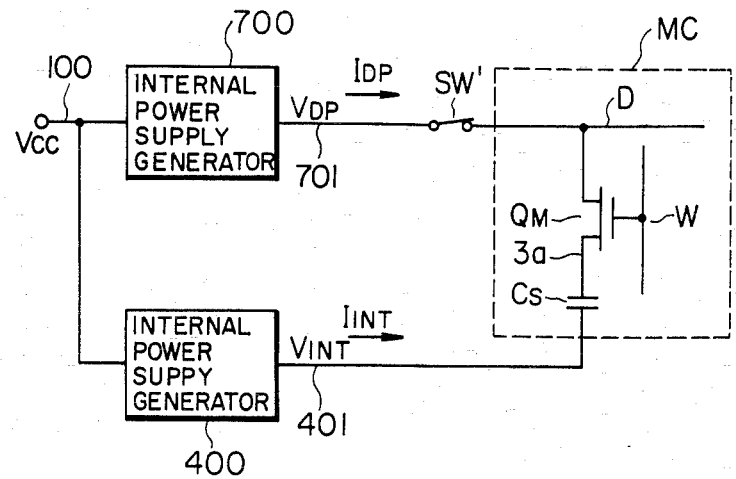
Figure 20B:
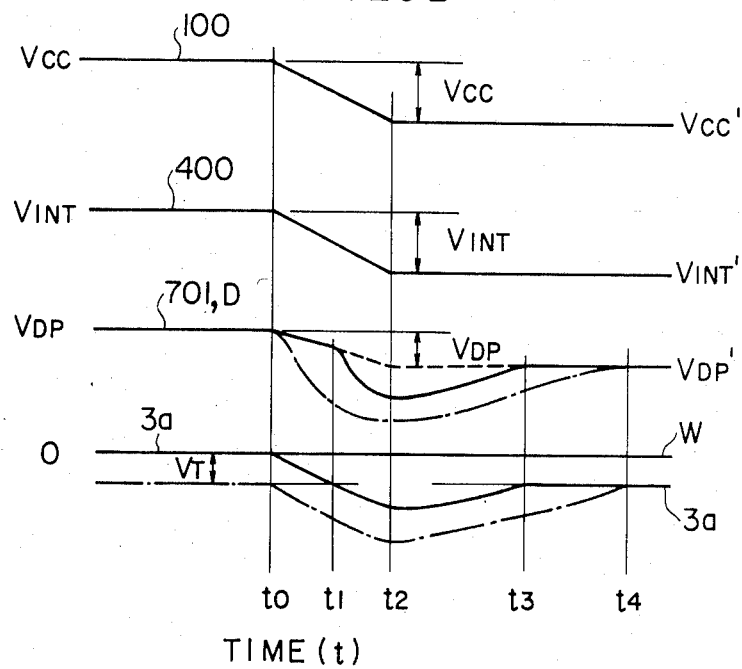

FIG. 20B shows waveforms of the outputs 401 and 701 of the internal power supply generators 400 and 700, respectively, the potentials of the data line D, the node 3a in the memory cell and the word line W, varying due to fluctuations of the external power supply voltage $V_{CC}$ or other reasons, when the switch SW' is switched-on, i.e. in the precharge operation state. In the figure is shown a case, where information "0" is stored in the memory cell 10 and the potential of the node 3a is at the low level ($\approx 0$ V). Further, since the precharge state is supposed, the potential of the word line W is 0 V. Here the relative difference in potential between different waves has no special meaning. The absolute value in potential should be naturally set suitably according to the purpose.

Now, when the voltage of the external power supply 100 varies from $V_{CC}$ to $V_{CC}'$ ($\leq V_{CC}$) during a period of time $t_1$–$t_2$, $V_{INT}$ and $V_{DP}$ follow the variations of $V_{CC}$ and tend to vary toward $V_{INT}'$ and $V_{DP}'$, which $V_{INT}$ and $V_{DP}$ take respectively, when the voltage of the external power supply 100 is $V_{CC}'$. In this stage the problems as indicated below take place. That is, the potential of the node 3a varies in the negative direction due to the coupling through the capacity $C_S$ with variations in $V_{INT}$. In this way, when the potential of the node 3a decreases to a value which is lower than 0 V by more than the threshold voltage $V_T$ of the MOS transistor $Q_M$, since the word line W is at 0 V, the transistor $Q_M$ is switched-on. As the result, current flows from the data line D to the capacity $C_S$ and thus the potential of the data line D and that of the line 701 decrease. Since these variations are provoked by the capacitive coupling, all these potentials of the node 3a, the line 701 and the data line D return to their initial values, but their reinstallment is retarded. If, in the course of this reinstallment, the precharge state is established and the memory operation begins, important erroneous works can be produced. Further, in the case where the back bias is applied to a negative $V_{BB}$ (FIGS. 3A, 3B, etc.), since, in the worst case, the potential of the node 3a can reach the critical value, for which the transistor $Q_M$ is switched-on, i.e. $-V_T$ due to leakage current between the node 3a and the substrate, $V_{INT}$ begins to vary and at the same time the transistor $Q_M$ is switched-on. Therefore, the problem explained above becomes more noticeable. In order to resolve this problem by making $V_{DP}$ follow variations of $V_{INT}$, according to this embodiment the transient response speed of the internal power supply generator 700 producing $V_{DP}$ is higher than that of the generator 400, i.e. the current supply capability for $I_{DP}$ of the generator 700 is comparatively great. This current supply capability may be chosen approximately as follows:

$$I_{DP} \gtrsim n \cdot C_S \cdot \frac{\Delta V_{INT}}{\Delta t} \quad (7)$$

where n represents the number of memory cells which are to be taken into account at the moment of these variations and is usually selected to be the total number of memories; $C_S$ is the value of the storage capacity per memory cell; $\Delta V_{INT}$ is the amount of the variation of $V_{INT}$; and $\Delta t$ is the duration of the variation, $\Delta V_{INT}/\Delta t$ indicating the average amount of variation of $V_{INT}$ per unit time. If this condition is fulfilled, $V_{DP}$ varies, following approximately $V_{INT}$ and no problem as stated above is posed. Furthermore, in the case where $\Delta t$ is extremely short, since $V_{DP}$ may be so set that it returns to its initial value $V_{DP}'$ in the minimum nominal value (20–100 ns) of the precharge period $t_p$ of the memory, the value of $t_p$ can be used instead of $\Delta t$ in Eq. (7).

Various modifications are possible in the embodiment just described. For example, $V_{DP}$ and $V_{INT}$ can be set to various values, depending on the object to be resolved. For example, the method, by which the voltage of the precharge for the data line is $V_{CC}/2$, can be applied. Various methods are conceivable for the production of $V_{CC}/2$; namely, a method by which it is produced by the internal power supply generator 700, a method, by which, although the internal power supply generator 700 is added for compensating leakage current, $V_{CC}/2$ is produced mainly by charge sharing between parasitic capacities of the two data lines forming a pair by short-circuiting them at the termination of an operation, etc. The method, by which $V_{INT}$ and $V_{DP}$ have a same value of $V_{CC}/2$ and they are supplied by a common internal power supply generator, as indicated in 1985 ISSCC Digest of Technical Papers, pp. 250–251, can be also applied as it is, if the common internal power supply generator is so designed that its supply capacity satisfies Eq. (7). Further, although the method for setting the current driving capability can be different, depending on the type of the circuit used, when it is realized by the circuit as shown in FIG. 4A, it can be set arbitrarily by varying the resistance value of $R_{INT}$. When it is realized by the circuit as shown in FIG. 5A, the driving capability can be set arbitrarily by controlling the capacity $C_{PI}$ or the frequency of the oscillator OSC'.

As explained above, according to this invention, it is possible to resolve efficaciously problems such as large spike currents, erroneous works, etc. taking place at the moment of the switch-on of the power supply or due to voltage functions during working.

We claim:

1. A semiconductor device formed on a semiconductor chip comprising:
   a plurality of circuits formed on the semiconductor chip;
   a voltage transformation means formed on the chip including means for transforming an external power supply voltage supplied from an external power supply into a predetermined internal power supply voltage;
   means for coupling said predetermined internal power supply voltage generated by said voltage transformation means to predetermined ones of said circuits; and
   means for delaying a starting time for an increase of said internal power supply voltage at a moment when said external power supply is switched on to start later than the starting time of an increase of said external power supply voltage, and/or for increasing a time necessary for said internal power supply voltage to rise to a predetermined internal voltage operational value to be longer than a time necessary for said external power supply voltage to rise to a predetermined external voltage operational value.

2. A semiconductor device according to claim 1, wherein the predetermined operational levels of said internal power supply voltage and said external power supply voltage are substantially equal to one another.

3. A semiconductor device according to claim 1, wherein said coupling means couple said predetermined internal power supply voltage to predetermined ones of said circuits which would generate spike currents if they were supplied with said external power supply voltage when said external power supply is turned on.

4. A semicohductor device according to claim 1, wherein said voltage transformation means includes at least a charge pumping circuit and a circuit for generating signals for the charge pumping.

5. A semiconductor device according to claim 4, wherein said circuit for generating signals for the charge pumping includes a self-starting oscillation circuit.

6. A semiconductor device according to claim 5, further comprising a back bias generator formed on said semiconductor chip including means for applying a predetermined back bias to a semiconductor substrate of said semiconductor chip, wherein said self-starting oscillation circuit is commonly used both by said voltage transformation means and by said back bias generator means.

7. A semiconductor device according to claim 1, wherein said semiconductor device is an information memory dvice composed by a group of memory cells, each of which includes an information storage capacitor and a switching MOS transistor, said device further comprising a first electrode group being comprised of one of the terminals of every capacitor in said group of memory cells and being connected with an output terminal of said voltage transformation means which supplies said internal power supply voltage.

8. A semiconductor device according to claim 1, wherein the supply of said internal voltage to said first electrode group is effected through a switching means which is controlled to have an on-off operation in synchronism with the operation of said semiconductor device.

9. A semiconductor device according to claim 8, wherein said first electrode group is divided into a plurality of groups, at least two of which use said switching means in common, and at least one of said at least two is in a non-active state, when said information memory device is in the active state.

10. A semiconductor device according to claim 1, wherein said semiconductor device is an information memory device composed by a group of memory cells, each of which includes an information storage capacitor and a switching MOS transistor, in which one of source and drain electrodes is connected with one of the electrodes of said capacitor; the other of the drain and source electrodes is connected with a first signal line; and the gate electrode is connected with a second signal line, said first signal line being precharged by said internal power supply voltage, which is the output of said voltage transformation means.

11. A semiconductor device according to claim 10, wherein said voltage transformation means has a driving capability $I_{DP}$ represented by $$I_{DP} \geq n \cdot C_S \cdot \frac{\Delta V_{INT}}{\Delta t}$$

where
n: number of memory cells which are to be taken into account at the moment of variations in power supply voltage
$C_S$: storage capacity per memory cell,
$\Delta V_{INT}$: amount of variation in $V_{INT}$, and
$\Delta t$: duration of the variation.

12. A semiconductor device according to claim 11, wherein $\Delta t$ is equal to a period $t_P$ necesary for the precharge of the memory.

13. A semiconductor device formed on a semiconductor chip comprising:

a plurality of circuits formed on the semiconductor chip;
a voltage transformation means formed on the chip including means for transforming an external power supply voltage supplied from said an external power supply into a predetermined internal power supply voltage;
means for coupling said predetermined internal power supply voltage generated by said voltage transformation means to predetermined ones of said circuits;
means for delaying a starting time for an increase of said internal power supply voltage at a moment when said external power supply is switched on to start later than the starting time of an increase of said external power supply voltage, and/or for increasing a time necesary for said internal power supply voltage to rise to a predetermined internal voltage operational value to be longer than a time necessary for said external power supply voltage to rise to a predetermined external voltage operational value;
a back bias generator means formed on said semiconductor chip for applying a predetermined back bias to a semiconductor substrate of said semiconductor chip; and
means for delaying a starting time of an increase of said back bias at a moment when said external power supply is switched on to start later than the starting time of an increase of external power supply voltage, and/or for increasing a time necessary for said back bias to rise to a predetermined back bias operational value to be longer than a time necessary for said external power supply voltage to rise to a predetermined external voltage operational value.

14. A semiconductor device according to claim 13, wherein a starting time of an increase of said internal power supply voltage at the moment of the switch-on of the external power supply is almost equal to or later than the starting time of an increase of said back bias and/or the time necessary for the increase of said internal power supply voltage at said moment to a predetermined internal voltage operational value is almost equal to or longer than the time necessary for said back bias to increase to said predetermined back bias operational value.

15. A semiconductor device according to claim 13, wherein said back bias generator means includes a charge pumping circuit and a circuit for generating signals for the charge pumping.

16. A semiconductor device according to claim 15, wherein said circuit for generating signals for the charge pumping includes of a self-starting oscillation circuit.

17. A semiconductor device according to claim 16, wherein said self-starting oscillation circuit is commonly used both by said voltage transformation means and by said back bias generator means.

18. A semiconductor device according to claim 13, wherein said coupling means couple said predetermined internal power supply voltage to predetermined ones of said circuits which would generate spike currents if they were supplied with said external power supply voltage when said external power supply is turned on.

* * * * *